United States Patent [19]

Pfiester

[11] Patent Number: 4,847,213

[45] Date of Patent: Jul. 11, 1989

[54] PROCESS FOR PROVIDING ISOLATION BETWEEN CMOS DEVICES

[75] Inventor: James R. Pfiester, Austin, Tex.

[73] Assignee: Motorola, Inc., Schaumburg, Ill.

[21] Appl. No.: 242,654

[22] Filed: Sep. 12, 1988

[51] Int. Cl.$^4$ .................. H01L 21/265; H01L 21/316; H01L 21/32

[52] U.S. Cl. ........................................ 437/24; 437/34; 437/57; 437/70

[58] Field of Search ............... 437/27, 28, 29, 34, 437/57, 69, 70, 24

[56] References Cited

U.S. PATENT DOCUMENTS

| | | | |
|---|---|---|---|
| 4,407,696 | 10/1983 | Han et al. | 437/70 |
| 4,447,290 | 5/1984 | Matthews | 437/228 |
| 4,481,705 | 11/1984 | Haskell | 437/34 |
| 4,570,325 | 2/1986 | Higuchi | 357/47 |
| 4,743,563 | 5/1988 | Pfiester et al. | 437/24 |

FOREIGN PATENT DOCUMENTS

| | | | |
|---|---|---|---|
| 58-40839 | 3/1983 | Japan | 437/70 |
| 61-81649 | 4/1986 | Japan | 437/69 |

Primary Examiner—Olik Chaudhuri
Attorney, Agent, or Firm—John A. Fisher

[57] ABSTRACT

A process is disclosed for the selective oxidation of MOS devices which preferentially removes implanted field doping from selected silicon substrate regions. In one embodiment, a CMOS substrate is provided with an overlying layer of silicon oxide and a layer of polycrystalline silicon. Active and field regions are defined in each of the CMOS device regions. A blanket boron implantation dopes both the N-type and P-type field regions. The N-type field region is selectively oxidized at a greater oxidation rate than is the P-type field region to cause a greater segregation of boron impurities into the growing oxide over the N-type field region. Regions of enhanced boron doping are thus formed under the field oxide in the P-type region, but not in the N-type region.

10 Claims, 4 Drawing Sheets

PROCESS FOR PROVIDING ISOLATION BETWEEN CMOS DEVICES

BACKGROUND OF THE INVENTION

This invention relates generally to a process for fabricating CMOS devices, and more specifically to an improved process for providing isolation between CMOS devices.

Many integrated circuit devices are being designed today using CMOS technology. The trend of these integrated circuits is towards larger circuit functions, more complex device structures, and a reduction in device size. The complexity and size of the devices makes it difficult to design manufacturing processes that are both high yielding and reliable. It is necessary, therefore, that any process be designed to reduce manufacturing steps and to make each manufacturing step highly reproducible.

Electrical isolation between individual devices of the integrated circuit is accomplished by a thick field oxide which is formed between active device regions. The thick field oxide increases the threshold voltage of any parasitic device which may exist between adjacent active regions and prevents the inadvertent electrical coupling of such regions. To insure the electrical isolation, additional doping is used beneath the field oxide, especially in P-type surface regions, to further increase the parasitic threshold voltage. Although the high field threshold voltage is absolutely necessary to the reliable functioning of the integrated circuit device, a properly aligned thick field oxide and (where appropriate) field doping must be accomplished with a minimum of critical processing steps.

Accordingly, a need existed for a process to provide acceptable field isolation between CMOS devices with minimal mask count. In this context, "mask count" refers to the number of photolithographic masking operations that must be performed to fabricate the device.

It is therefore an object of this invention to provide an improved process for fabricating CMOS devices.

It is a further object of this invention to provide an improved process for fabricating CMOS devices with acceptable levels of electrical isolation between adjacent devices.

It is a still further object of this invention to provide an improved process for fabricating CMOS devices with a minimum of masking operations.

BRIEF SUMMARY OF THE INVENTION

The foregoing and other objects and advantages of the invention are achieved through a process of selective oxidation which preferentially removes field doping from selected silicon substrate regions. In accordance with one embodiment of the invention, a silicon substrate is provided which has P-type and N-type surface regions. A thin layer of insulator material and a layer of polycrystalline silicon are formed overlying the silicon substrate. Active and field areas are defined in each of the N-type and P-type regions. Boron ions are implanted into the field regions of both the N-type and P-type surface regions without resort to a lithographic masking operation. The field area of the N-type surface region is then oxidized selectively at a greater oxidation rate than is the field area of the P-type surface region. During the thermal oxidation, some of the ion implanted boron segregates into the grown thermal oxide with the amount of segregating boron proportional to the amount of thermal oxide grown. Thus more of the ion implanted boron from the N-type surface region segregates into the thermal oxide than does boron from the P-type surface region because of the greater oxide growth in the N-type region.

DETAILED DESCRIPTION OF PREFERRED EMBODIMENTS

CMOS integrated circuits include a large number of closely spaced N-channel MOS transistors and P-channel MOS transistors. To operate reliably, it is necessary that a high degree of electrical isolation exist between adjacent transistors of either the same or different type. Electrical isolation between devices is achieved by providing a thick field oxide between devices and, additionally, by providing an enhanced P-type doping beneath the field oxide between and surrounding N-channel devices. In accordance with the invention, a process is provided for obtaining the thick field oxide and the enhanced P-type doping with a minimum number of additional processing steps.

During the thermal oxidation of an impurity doped silicon substrate, the redistribution of the impurities in the combined silicon/silicon dioxide structure is determined by the segregation coefficient for the particular impurity present, the length of the oxidation process, and by the thickness of oxide grown. For some impurities, the segregation coefficient dictates that a large proportion of the impurity segregates into the oxide, while for others the coefficient dictates that most of the impurity remains in the silicon. For example, the significant segregation of boron into a growing thermal oxide from the underlying silicon substrate is known. The greater the thickness of the grown thermal oxide, the greater the segregation of boron from the silicon into the silicon dioxide. In accordance with the invention, selective field oxidation is utilized to selectively adjust the field doping in the N-type and P-type surface regions of the silicon substrate.

Figure 1:
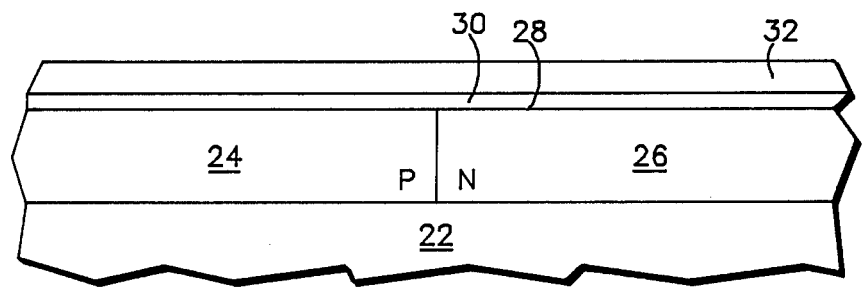
FIGS. 1–5 illustrate process steps in accordance with one embodiment of the invention.

FIGS. 1–5 illustrate schematically, in cross-section, process steps in accordance with one embodiment of the invention. In accordance with this embodiment of the invention, a CMOS device is fabricated in a silicon substrate 22, as illustrated in FIG. 1. Substrate 22 includes a P-type surface region 24 and an N-type surface region 26. The N-channel MOS transistors of the CMOS device will be formed in P-type surface region 24 and the P-channel MOS transistors will be formed in N-type surface region 26. Overlying surface 28 of substrate 22 is formed a thin layer of silicon dioxide or other insulator 30 and a layer of undoped polycrystalline silicon 32. Oxide 30, which can have a thickness of, for example, 20–50 nanometers, serves as a spacer between the single crystalline substrate and polycrystalline silicon layer 32. In subsequent processing it also serves as a pad oxide to optimize an ion implantation step. Polycrystalline silicon layer 32 preferably has a thickness of about 50–100 nanometers.

Figure 2:
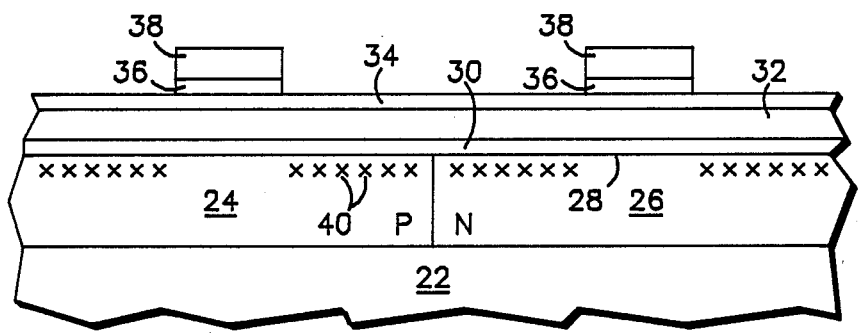

The process continues, as illustrated in FIG. 2 by the formation of an optional layer of oxide 34 on the upper surface of polycrystalline silicon layer 32. This oxide can be formed by thermally oxidizing the polycrystalline silicon or by depositing, such as by chemical vapor deposition (CVD), a low temperature oxide layer. A layer of silicon nitride 36 or other oxidation resistant material is then deposited overlying oxide layer 34. Oxide layer 34 (when used) preferably has a thickness of about 20 nanometers and nitride layer 36 preferably has a thickness of about 75-150 nanometers. Optionally a further oxide layer (not shown) is deposited on nitride layer 36 to protect that layer from a subsequent polycrystalline silicon etch. Nitride layer 36 is then patterned using a layer 38 of photoresist and standard photolithographic and etch techniques to leave the nitride over what will become the active areas of the CMOS circuit and to remove the nitride from what will become the field areas of the circuit. The optional layer of oxide 34 serves as an etch stop layer to protect polycrystalline silicon layer 32 during the etching of nitride layer 36. Layer 34 is not needed if the etchant used to pattern nitride layer 36 is sufficiently selective to nitride relative to silicon.

With photoresist 38 still in place, the structure is ion implanted with boron ions at an energy selected to implant the ions just below surface 28 of substrate 22. The implanted boron ions, which are illustrated in FIG. 2 by x's 40, penetrate oxide layer 34, polycrystalline silicon layer 32 and oxide layer 30. This boron will provide the additional doping necessary at the surface of P-type region 24 to insure an adequate field threshold voltage in that region. The boron implantation is accomplished without requiring an additional masking operation because the same resist mask 38 was used for patterning the nitride as well as for masking the implant. The implant can be done, for example, using singly ionized boron implanted at an energy of about 100 kev to a dose of $2 \times 10^{13} cm^{-2}$.

Figure 3:
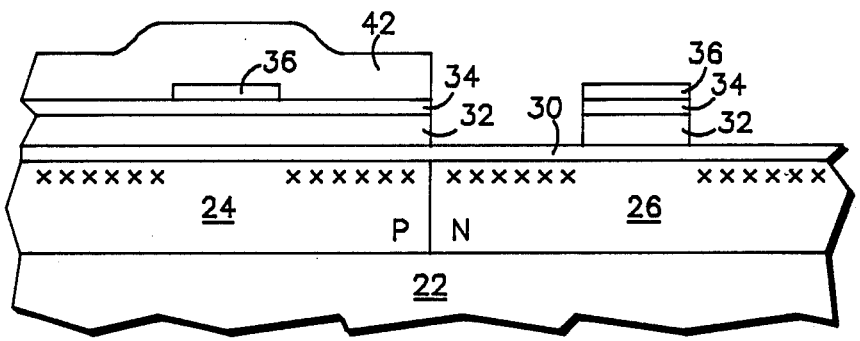

After stripping off photoresist mask 38, an additional layer of photoresist is applied to the structure and photolighographically patterned to leave a masking layer of photoresist 42 overlying P-type surface area 24. Using photoresist 42 and nitride 36 as etch masks, oxide layer 34 and polycrystalline silicon layer 32 are selectively etched as illustrated in FIG. 3. The etching of polycrystalline silicon layer 32 is terminated when oxide layer 30 is exposed so that monocrystalline substrate 32 is not etched. The presence of the optional layer of deposited oxide over the top of nitride layer 36 protects the nitride furing the etching of polycrystalline silicon layer 32.

Figure 4:
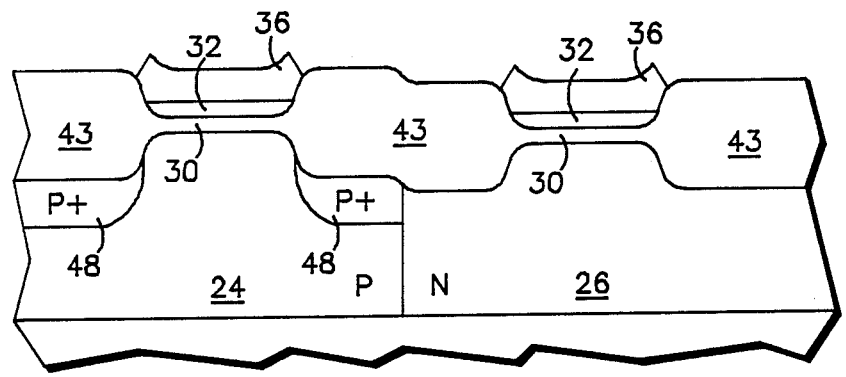

Photoresist layer 42 is then stripped from the structure and a field oxide 43 is grown by thermal oxidation. For example, the field oxide is grown in a steam ambient at about 1000° C. for about 200 minutes. The resulting structure is illustrated in FIG. 4. During the thermal oxidation cycle, the silicon which is not protected by an overlying layer of silicon nitride or other oxidation masking material is thermally oxidized. Thus the surface of N-type region 26 is oxidized to a thickness of approximately 700 nanometers. Simultaneously, the exposed portion of polycrystalline silicon layer 32 is also oxidized. After the exposed portion of layer 32 is completely oxidized, the oxidation continues, causing the oxidation of P-type surface region 24. Polycrystalline silicon layer 32 thus delays the oxidation of the P-type surface region 24 relative to the oxidation of N-type surface region 26. the relatively longer oxidation of region 26 causes more depletion of the ion implanted boron from the surface of that region compared to the depletion of boron from region 24.

Figure 5:
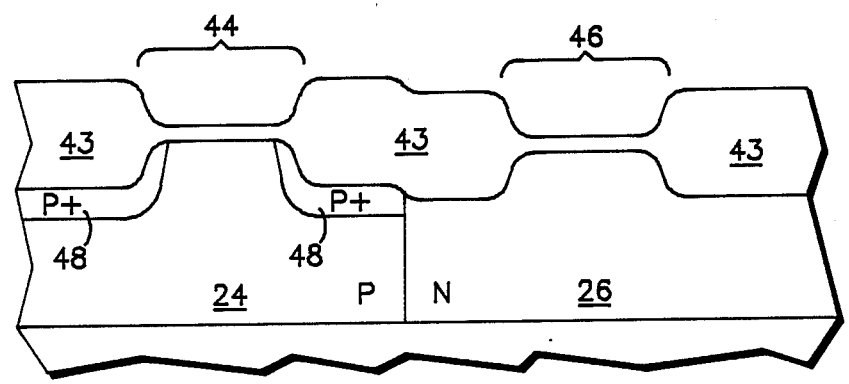

After field oxidation, silicon nitride 36 and any remaining polycrystalline silicon 32 are etched from the substrate surface to obtain the structure illustrated in FIG. 5. The resulting structure includes an active region 44 in P-type surface region 24 and an active region 46 in N-type surface region 26. Active regions 44 and 46 are electrically isolated from each other by a thick field oxide 43. Underlying field oxide 43 in P-type surface region 24 is a region 48 of enhanced P-type doping. There is no comparable region of enhanced doping underlying field oxide 43 in the surface of N-type region 26 because the selectively increased oxidation rate during the initial portion of the oxidation cycle of region 26 caused the segregation into field oxide 43 of most of the boron implanted into that region. The fabrication of the CMOS device then continues in conventional manner to form source and drain regions, gate structures, metallization, and the like.

Figure 6:
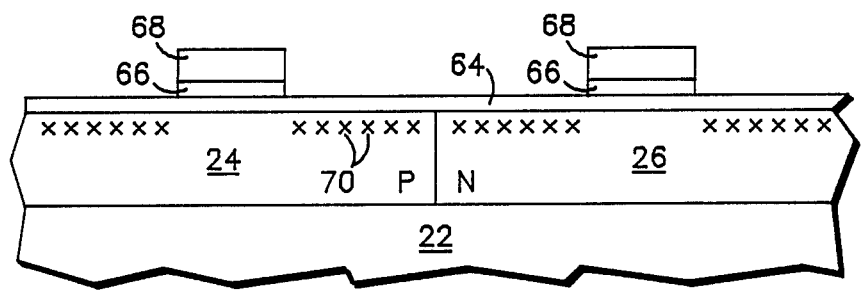
FIGS. 6 and 7 illustrate process steps in accordance with a variation of the process illustrated in FIGS. 1–5.
Figure 7:
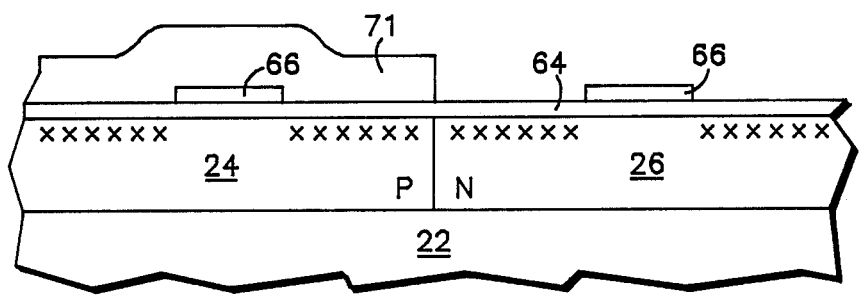

FIGS. 6 and 7 illustrate the essential steps in a variation of the above described embodiment. As illustrated in FIG. 6, the process starts with the same type of silicon substrate 22. Overlying the surface of substrate 22, a thin layer of silicon dioxide 64 is grown and a layer of silicon nitride 66 is deposited. A layer of photoresist 68 is deposited and patterned on silicon nitride 66. Nitride layer 66 is patterned using the patterned photoresist as an etch mask to remove the silicon nitride from what will become the field areas of the integrated circuit structure. Boron ions are then implanted into the surface of substrate 22 using the patterned nitride 66 and patterned photoresist 68 as an ion implantation mask. Location of the boron ions at the surface of substrate 22 is indicated by x's 70.

After removing photoresist layer 68, a polycrystalline silicon layer 71 is deposited over the surface of the structure to a thickness of about 50-100 nanometers. A layer of photoresist (not shown) is then deposited and patterned to cover P-type surface region 24. Using this patterned photoresist as an etch mask, polycrystalline silicon layer 71 is etched to remove the layer overlying N-type surface region 26 as illustrated in FIG. 7. This structure is then thermally oxidized, as above, to oxidize polycrystalline silicon layer 71 and the field regions of silicon substrate 22. Because of the presence of the patterned polycrystalline silicon layer, the surface of N-type surface region 26 is oxidized to a greater extend than is P-type surface region 24. This results in the greater segregation of boron impurities into the thermally grown oxide overlying region 26 relative to region 24. Accordingly, the result is a structure having a thick field oxide separating active device regions with an enhanced P-type doping beneath the field oxide in the the P-type surface region.

Figure 8:
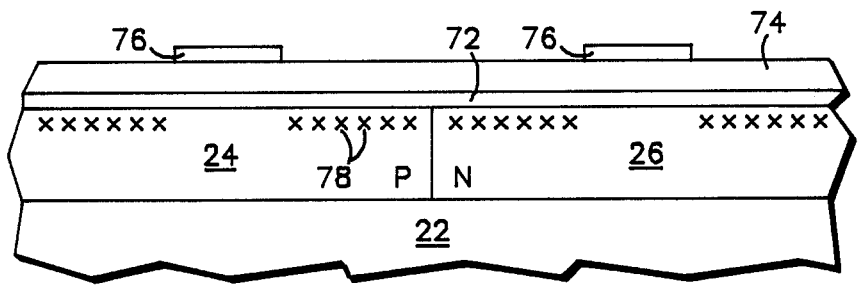
FIGS. 8–10 illustrate process steps in accordance with a further embodiment of the invention.
Figure 9:
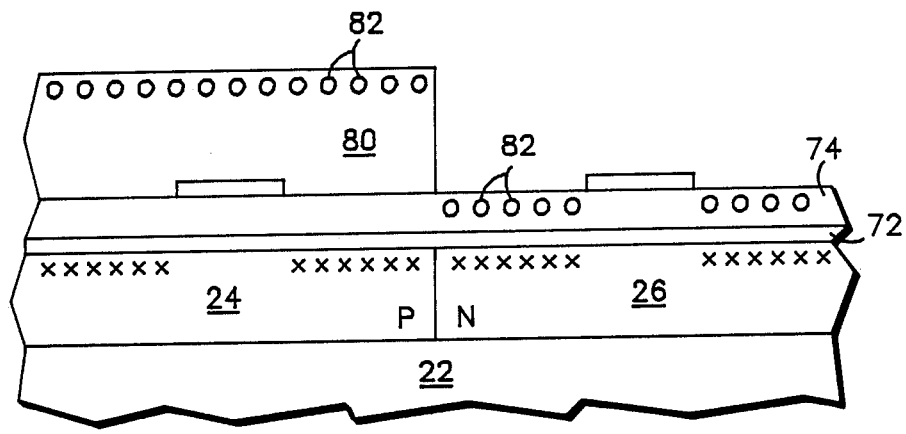
Figure 10:
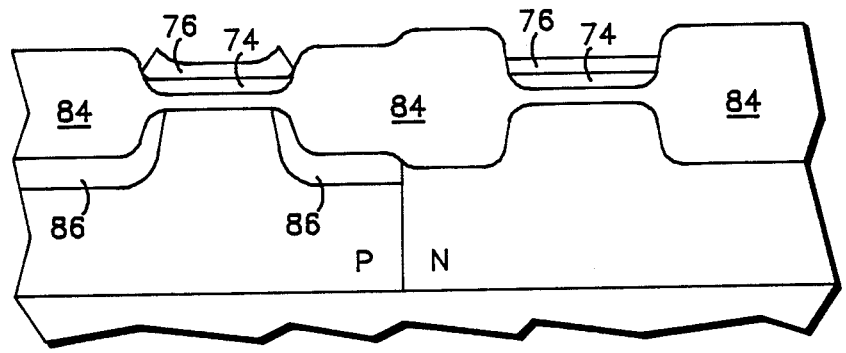

FIGS. 8-10 illustrate a still further embodiment of the invention. In general, the invention utilizes a selective, differential oxidation of the substrate surface to control the resultant doping of the silicon surface beneath a thick field oxide. In accordance with this embodiment of the invention, selective implantation of halogen ions is used to alter the oxidation rate of a polycrystalline silicon layer. It is known that halogen implants can be used to increase the oxidation rate of silicon. The direct implantation of halogen ions into the monocrystalline silicon substrate to selectively increase the oxidation rate of that substrate, however, has been found to cause potential problems with increased junction leakage. This embodiment of the invention take advantage of the increased oxidation rate resulting from the halogen implantation, but avoids problems of increased leakage.

As illustrated in FIG. 8, this embodiment of the invention starts with a semiconductor substrate 22 similar to that used for the above described embodiments. Substrate 22 includes a P-type surface region 24 and an N-type surface region 26. Overlying the surface of substrate 22 is a thin oxide 72 and a layer of undoped polycrystalline silicon 74. The oxide layer is preferably grown to a thickness of about 10 nanometers and the polycrystalline silicon is preferably chemically vapor deposited to a thickness of 50–100 nanometers. A layer of silicon nitride is then deposited on the polycrystalline silicon and patterned to form patterned silicon nitride layers 76 which overlay what will become the active areas of the integrated circuit. Boron ions are then implanted into those regions of the silicon surface which are not covered by the silicon nitride 76 and the photoresist (not shown) which was used to pattern the silicon nitride. The location of the boron ions in the field regions of the circuit are indicated by the x's 78.

As illustrated in FIG. 9, a layer of photoresist 80 is applied to the structure and patterned to leave the photoresist overlying N-type surface region 24. A halogen ion, preferably chlorine, is then implanted into the exposed portions of polycrystalline layer 74 as indicated by the circles 82. Photoresist layer 80 masks the polycrystalline silicon overlying P-type region 24 from the chlorine implantation.

Photoresist layer 80 is then stripped from the structure and a thermal oxide having a thickness of 500–750 nanometers is grown. The chlorine implant into the polycrystalline silicon enhances the oxidation surface reaction rate of the chlorine doped polycrystalline silicon by a factor of 10 relative to the undoped polycrystalline silicon. Because the polycrystalline silicon over the N-type surface region 26 oxidizes more rapidly during the beginning of the field oxidation than does the polycrystalline silicon over the P-type surface region 24, N-type surface region 26 will be oxidized to a greater extent than will P-type surface region 24, and more of the ion implanted boron will be segregated into the oxide over region 26 than into the oxide over region 24. This results in a thick field oxide 84 as illustrated in FIG. 10. The field oxide is located in those regions not protected by silicon nitride 76. Beneath the oxide overlying P-type surface region 24 is a region 86 of enhanced P-type doping which results from the residual ion implanted boron. This enhanced doping increases the field threshold voltage of region 24.

Because the halogen implant is into polycrystalline silicon layer 74 and not into the monocrystalline silicon substrate 22 there is no degradation in junction leakage for a device which is ultimately fabricated in the substrate. The localized regions of enhanced boron concentration are achieved without additional masking steps.

As a specific, but non-limiting example which serves to further illustrate preferred embodiments of the invention, wafers were prepared in accordance with the embodiment disclosed in FIGS. 1–5. The wafers were prepared with an undoped polycrystalline silicon layer having a thickness of 100 nanometers. Boron ions were implanted at 35 kev to a dose of $2 \times 10^{13}$ cm$^{-2}$. A field oxide was grown at 1000° C. for 215 minutes to achieve a final field oxide thickness of 750 nanometers. The field threshold voltage over the P-type surface region was measured to be 16.8 volts. The doping under the thick field oxide was measured to be $4.7 \times 10^{16}$ cm$^{-3}$. The field threshold voltage over the N-type surface region was measured to be $-21.3$ volts and the doping under the thick field oxide was measured to be $3.9 \times 10^{16}$ cm$^{-3}$. As controls, devices were also fabricated with a layer of polycrystalline silicon over the N-type surface region, without polycrystalline silicon over the P-type surface region, with no polycrystalline silicon and with no boron implantation for either region. For these controls, the results were as follows: with no polycrystalline silicon over the N-type surface region the field threshold voltage was found to be $-16$ volts and the doping under the field oxide was measured to be $1.2 \times 10^{16}$ cm$^{-3}$. With no polycrystalline silicon over the P-type surface region the field threshold voltage was measured to be 5.19 volts and the doping under the field oxide was $2.2 \times 10^{16}$ cm$^{-3}$. With no polycrystalline silicon and with no boron ion implantation, the field threshold voltage over the P-type surface region was found to be 5.4 volts and the doping under the field oxide was $1.4 \times 10^{16}$ cm$^{-3}$. The field threshold voltage in the N-type surface region was measured to be $-23.7$ volts and the doping under the field oxide was $4.8 \times 10^{16}$ cm$^{-3}$.

Thus it is apparent that there has been provided, in accordance with the invention, a process for fabricating CMOS integrated circuit devices which fully meets the objects and advantages set forth above. With few additional processing steps and no additional critical masking steps, acceptable threshold voltages have been achieved for both N-channel and P-channel MOS transistors. Although the invention has been described and illustrated with reference to specific embodiments thereof, it is not intended that the invention be limited to these illustrative embodiments. Those skilled in the art will recognize that variations and modifications are possible without departing from the spirit of the invention. For example, the polycrystalline silicon can be oxidized at a different temperature than that disclosed or can be oxidized in a two step process wherein the temperatures change during the process. Other times, temperatures, layer thickness, and the implant doses can also be utilized. It is intended that to include within the invention all such variations and modifications as fall within the scope of the appended claims.

I claim:

1. A method for fabricating a CMOS device which comprises the steps of:

providing a silicon substrate having a first P-type region and a second N-type region at a surface thereof;

forming a thin first layer of oxide overlying said surface;

forming a second layer of silicon overlying said first layer;

forming a patterned third layer of an oxidation resistant material overlying said second layer, said third layer overlying active portions of said first and second regions;

implanting boron ions into those portions of said first and second regions which are not overlaid by said third layer;

selectively implanting halogen ions into a portion of said second layer overlying said second region and not overlaid by said third layer;

and thermally oxidizing said second layer and said substrate to form field oxide regions at said surface.

2. The method of claim 1 wherein said step of forming a patterned third layer comprises the steps of:
depositing a layer of silicon nitride;
depositing a patterned layer of resist material overlying said layer of silicon nitride;
etching said layer of silicon nitride using said patterned layer of resist as an etch mask;
and retaining said patterned layer of resist as an ion implantation mask.

3. The method of claim 2 wherein said step of selectively implanting halogen ions comprises the step of implanting chlorine atoms using said patterned layer of resist as an implantation mask.

4. A method for fabricating a CMOS device which comprises the steps of:
providing a silicon substrate having a first P-type region and a second N-type region at a surface thereof;
forming a thin first layer of oxide overlying said surface;
forming a second layer of silicon overlying said first layer;
forming a patterned third layer of an oxidation resistant material overlying said second layer, said third layer overlying active portions of said first and second regions and exposing said second layer over field portions of said first and second regions;
implanting boron ions into those portions of said first and second regions which are not overlaid by said third layer;
selectively removing said second layer overlying said field portions of said second region; and
thermally oxidizing said second layer and said field portions of said substrate.

5. A method for fabricating a CMOS device which comprises the steps of:
providing a silicon substrate having a first P-type region and a second N-type region at a surface thereof;
forming a thin first layer of insulator overlying said surface;
forming a second layer of silicon overlying said first layer;
defining field areas and active areas in each of said first and second regions;
ion implanting boron ions into said field areas of each of said first and second regions; and
selectively differentially oxidizing field portions of said second region relative to field portions of said first region by removing portions of said second layer overlying said second region; and
oxidizing said second layer and said substrate.

6. A method for fabricating a CMOS device which comprises the steps of:
providing a silicon substrate having a first P-type region and a second N-type region at a surface thereof;
forming a thin first layer of insulator overlying said surface;
forming a second layer of silicon overlying said first layer;
defining field areas and active areas in each of said first and second regions;
ion implanting boron ions into said field areas of each of said first and second regions; and
selectively differentially oxidizing field portions of said second region relative to field portions of said first region by
selectively implanting halogen ions into said second layer of silicon; and
thermally oxidizing said second layer and said silicon substrate.

7. The method of claim 6 wherein said step of selectively implanting comprises the step of implanting chlorine ions into said second layer overlying field areas of said second region.

8. A method for fabricating a CMOS device which comprises the steps of:
providing a silicon substrate having a first P-type region and a second N-type region;
forming a layer of oxidation resistant material overlying said silicon substrate;
patterning said layer of oxidation resistant material to leave said material overlying active portions of said first and second regions and exposing field portions of said first and second regions;
ion implanting boron ions into said field portions of said substrate;
forming a layer of polycrystalline silicon overlying said P-type region;
and selectively differentially oxidizing said substrate by thermally oxidizing said polycrystalline silicon and said exposed field portions of said silicon substrate, the presence of said polycrystalline silicon layer causing said N-type region to be oxidized to a greater extent than said P-type region.

9. The method of claim 8 wherein said step of forming a layer of oxidation resistant material comprises depositing a layer of silicon nitride.

10. The process of claim 8 wherein said step of forming a layer of polycrystalline silicon comprises depositing a layer of undoped polycrystalline silicon.

* * * * *